United States Patent
Cummings et al.

(10) Patent No.: US 8,679,941 B2
(45) Date of Patent: *Mar. 25, 2014

(54) METHOD TO IMPROVE WET ETCH BUDGET IN FEOL INTEGRATION

(75) Inventors: Jason E Cummings, Albany, NY (US); Lisa F Edge, Albany, NY (US); Balasubramanian S. Haran, Albany, NY (US); David V Horak, Albany, NY (US); Hemanth Jagannathan, Albany, NY (US); Sanjay Mehta, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/422,138

(22) Filed: Mar. 16, 2012

(65) Prior Publication Data

US 2012/0178236 A1 Jul. 12, 2012

Related U.S. Application Data

(63) Continuation of application No. 12/571,483, filed on Oct. 1, 2009, now Pat. No. 8,232,179.

(51) Int. Cl.
*H01L 21/76* (2006.01)

(52) U.S. Cl.
USPC .... 438/437; 438/427; 438/435; 257/E21.546; 257/E21.548

(58) Field of Classification Search
USPC .......................................... 438/435
See application file for complete search history.

(56) References Cited

U.S. PATENT DOCUMENTS

| | | | |
|---|---|---|---|
| 6,716,691 B1 | 4/2004 | Evans et al. | |
| 7,358,144 B2 | 4/2008 | Im | |
| 8,232,179 B2 * | 7/2012 | Cummings et al. | 438/435 |
| 2005/0090053 A1 | 4/2005 | Temmler et al. | |
| 2005/0239256 A1 | 10/2005 | Li et al. | |
| 2006/0054597 A1 | 3/2006 | Perng et al. | |
| 2006/0252227 A1 | 11/2006 | Lee et al. | |
| 2008/0001249 A1 | 1/2008 | Sheen et al. | |
| 2008/0111154 A1 | 5/2008 | Voldman | |
| 2008/0191311 A1 | 8/2008 | Wang et al. | |
| 2008/0197444 A1 | 8/2008 | Voerckel | |

* cited by examiner

*Primary Examiner* — Daniel Luke
(74) *Attorney, Agent, or Firm* — Steven Meyers; Kevin Anderson

(57) ABSTRACT

A method of forming a semiconductor device is provided where in one embodiment an STI fill is recessed below the pad nitride and pad oxide layers, to a level substantially coplanar with the top surface of the substrate. A thin (having a thickness in the range of about 10 Å-100 Å) wet etch resistant layer is formed in contact with and completely covering at least the top surface of the recessed STI fill material. The thin wet etch resistant layer is more resistant to a wet etch process than at least the pad oxide layer. The thin wet etch resistant layer may be a refractory dielectric material, or a dielectric such as $HfO_x$, $Al_yO_x$, $ZrO_x$, $HfZrO_x$, and $HfSiO_x$. The inventive wet etch resistant layer improves the wet etch budget of subsequent wet etch processing steps.

9 Claims, 20 Drawing Sheets

US 8,679,941 B2

METHOD TO IMPROVE WET ETCH BUDGET IN FEOL INTEGRATION

CROSS-REFERENCE TO RELATED APPLICATION

This application is a continuation of currently co-pending U.S. patent application Ser. No. 12/571,483, filed on Oct. 1, 2009, the subject matter of which is incorporated herein by reference in its entirety.

FIELD OF THE INVENTION

The present invention broadly relates to the manufacture of integrated circuits, and particularly to Front-End of the Line (FEOL) processing, and more particularly to a method of performing wet etch during an FEOL integration process flow.

BACKGROUND

While integrated circuit devices continue to shrink in size, the use of wet etch processes in the manufacture of CMOS (Complementary metal-oxide semiconductor) devices, for example, in Front-End Of the Line (FEOL) integration process flows, have not scaled. As a result, the size of divots, caused by the isotropic nature of wet etch, as a function of feature pitch has remained essentially flat for several generations of logic and ASIC (Application-Specific Integrated Circuit) devices.

For example, as the lateral spacing between devices decreases, divots that may be formed at the corners in narrowly spaced FET (field-effect transistor) islands will tend to merge, creating a recess in the shallow trench isolation (STI). On the other hand, where the separation between FET islands is relatively wide, the STI oxide will be relatively taller and may be left sticking up above the surface of the substrate.

For example, referring to FIG. 1, a typical process flow to form FET devices on a bulk substrate may include a wafer 100 having a first dielectric (pad) (i.e. oxide) layer 120 formed on a silicon substrate 110, and a second dielectric (e.g. nitride) layer 130 formed on the first pad oxide layer 120. Next, a patterned resist layer 140 is formed over the wafer 100, having openings 145 through which the upper surface of the wafer 100, i.e. the nitride layer 130, is exposed. Next, trenches 150 are formed in the substrate 110 by etching through the pad nitride 130, the pad oxide 120 and partially through the silicon substrate 110, for example, using an anisotropic etch, such as a reactive ion etch (RIE). The resist layer 140 may be removed, and the resulting structure is illustrated in FIG. 3.

Next, a third dielectric fill material 160 is deposited over the wafer 100, filling the trenches 150 and covering the top horizontal surfaces of the pad nitride 130. The fill oxide that covers the horizontal surfaces of the wafer is referred to as the field oxide (not shown). The third dielectric fill material 160 is preferably oxide, but may comprise other suitable dielectric materials such as poly-siloxane, polysilazane, or a combination thereof. The third dielectric fill material 160 may be deposited by any suitable method, such as spin-coating. An oxide fill material 160 may undergo a low temperature Ultraviolet (UV) cure or a high temperature thermal anneal process (for example, at temperatures above about 900° C. in $N_2$, forming gas or steam ambient). This is followed by a planarizing step, such as chemical-mechanical polishing (CMP) to remove field oxide from the surface of the pad nitride 130 and planarize the surface of the wafer 100, while leaving the trenches 150 filled with the third dielectric fill (e.g. oxide) material 160, which form shallow trench isolation (STI) structures, as illustrated in FIG. 4.

The pad nitride layer 130 is then removed, for example by using a wet etch selective to $SiO_2$, such as hot phosphoric acid chemistry at 160° C., leaving islands 161, 162 of oxide 160 protruding above the surface of the wafer 100 as illustrated in FIG. 5. In the example illustrated, the island 161 has a width W1 that is relatively narrow compared to the width W2 of the island 162, as defined relative to the depth d of the lateral etch. Multiple well implants (not shown for clarity) may be typically formed by implantation through the thin pad oxide layer 120, which is typically followed by the well diffusion anneals (not shown for clarity), as known in the art. Subsequently, the pad oxide layer 120 is removed, typically using a wet etch method which is isotropic and may be characterized by a lateral etch depth d, thus creating divots 165 along the corners of the oxide islands 161, as illustrated in FIG. 6.

Depending on the final application, a single chip could have multiple gate oxide thicknesses and threshold voltage ($V_t$) offerings. These multi-functionality requirements will typically add additional wet etch process steps, which increases the wet etch budget requirements, which in turn may lead to excessive divoting 175 in both the STI 160 and the substrate material 110, as illustrated in FIG. 7 and discussed further below.

In the case where the STI 161 has been defined relatively narrowly compared to the lateral wet etch depth d, the divots 175 may merge together, forming a recess 185, having a depth 180 below the surface of the substrate 110. On the other hand, if the STI 162 has been defined relatively widely compared to the lateral wet etch depth d, the divots 175 will etch into the substrate material 110 as well as the STI material 160, but the STI island 162 will have a top surface 172 that is relatively taller, by a height h above the top surface of the substrate 110, than the relatively narrow STI 161, as illustrated in FIG. 7. This difference in topography may continue to exist even after subsequent processing and may be challenging to remove as illustrated in FIG. 8.

This spacing-dependent topography in STI structures in critical device macros poses lithographic/RIE challenges during the gate patterning due to varying gate stack heights in the STI region resulting from the STI topography.

Prior attempts to reduce the wet etch budget have been difficult, particularly as more complex technology elements have been introduced on the same chip, such as multiple Vt and low power/high performance (i.e. having multiple gate oxide thicknesses) offerings, and the use of advanced stressor and salicidation schemes.

It would be desirable to provide a wet etch method that has a budget that scales with device size.

SUMMARY OF THE INVENTION

The present invention provides, in a first aspect, a method for manufacturing a semiconductor device, the method comprising the steps of providing a wafer comprising a semiconductor substrate, a first dielectric layer atop the semiconductor substrate, and a second dielectric layer atop the first dielectric layer, forming at least one recessed shallow trench isolation (STI) feature in said wafer, said recessed STI feature comprising a trench filled with a third dielectric fill material, said third dielectric fill material having a top surface substantially coplanar with or recessed below the uppermost top surface of the semiconductor substrate, wherein said second dielectric layer and said first dielectric layer are exposed along the sidewalls of said trench above the top surface of said third dielectric fill material; and forming a thin wet etch resistant dielectric layer over the wafer, said thin wet etch resistant dielectric layer in contact with and completely covering at least the top surface of said third dielectric fill material, said thin wet etch resistant dielectric layer comprising a fourth dielectric material that is more resistant to a wet etch process than at least said first dielectric layer, said thin wet etch resistant dielectric layer having a thickness in the range from about 10 Å-100 Å. The first dielectric layer is preferably resistant to a wet etch of said second dielectric layer.

The thin wet etch resistant dielectric layer may comprise a refractory dielectric material, or may comprise a dielectric material selected from the group consisting of $HfO_x$, $Al_yO_x$, $ZrO_x$, $HfZrO_x$, and $HfSiO_x$.

According to another aspect of the invention, the method may further include depositing a thin amorphous dielectric layer that is in contact with and at least completely covers the top surface of said third dielectric fill, and densifying said thin amorphous dielectric layer to form said thin wet etch resistant dielectric layer.

According to yet another aspect of the invention, the method may further include depositing a fourth dielectric fill material over said thin amorphous dielectric layer, and removing said fourth dielectric fill material and said thin amorphous dielectric layer from the top surface of said second dielectric layer prior to said step of densifying said thin amorphous dielectric layer. The method may further include removing said second dielectric layer using a wet etch method that is selective at least to said thin wet etch resistant dielectric layer, and removing portions of said thin wet etch resistant dielectric layer above said first dielectric layer selectively to said first dielectric layer.

The foregoing and other features and advantages of the invention will be apparent from the following detailed description of the invention.

BRIEF DESCRIPTION OF THE DRAWINGS

Referring to the exemplary drawings wherein like elements are numbered alike in the several figures, which are not necessarily drawn to scale, in which.

DETAILED DESCRIPTION OF THE INVENTION

A method in accordance with the invention presents a method for sealing STI (shallow trench isolation) trenches with a wet etch resistant film, such as a $HfO_2$ film, which method, in accordance with the invention, has the benefit of accommodating higher wet etch budget.

FIGS. 9-19 illustrate cross-sectional view of intermediate structures formed in one embodiment of a method for forming a structure in accordance with the invention.

Figure 1:
FIGS. 1-8 illustrate cross-sectional views of structures formed during a prior art method of forming shallow trench isolation in a semiconductor device.
Figure 2:
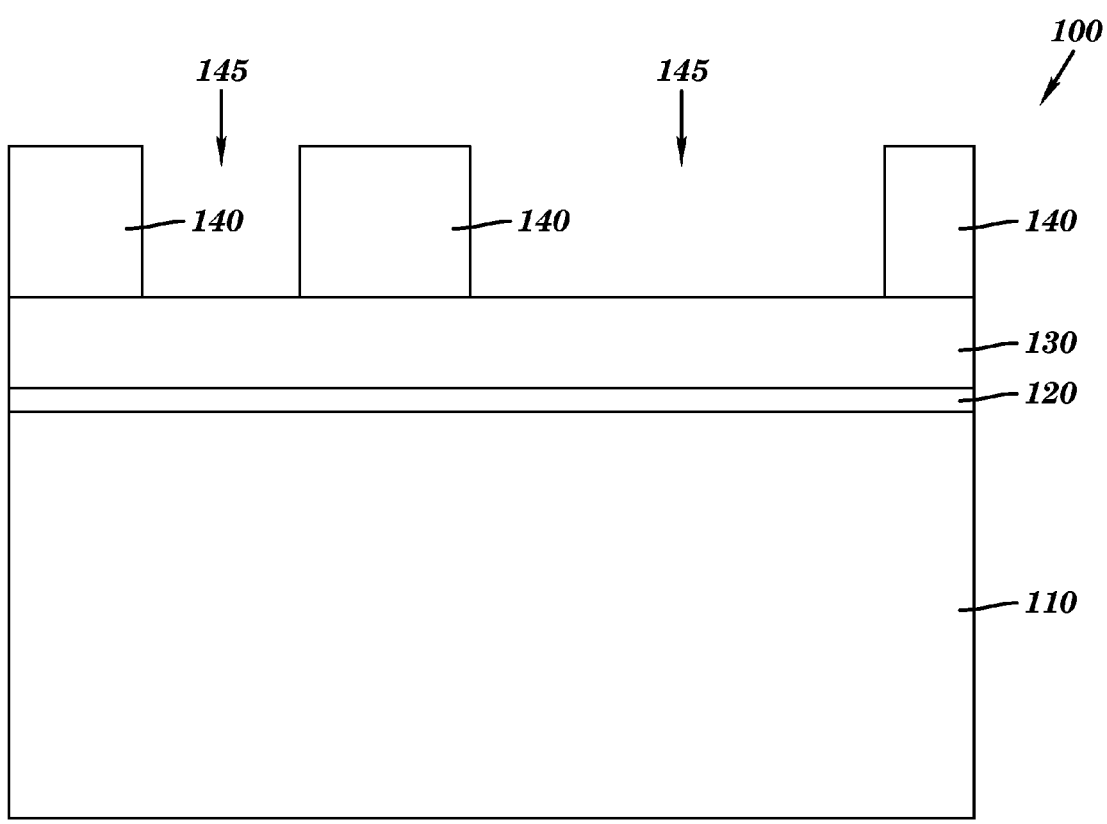
Figure 3:
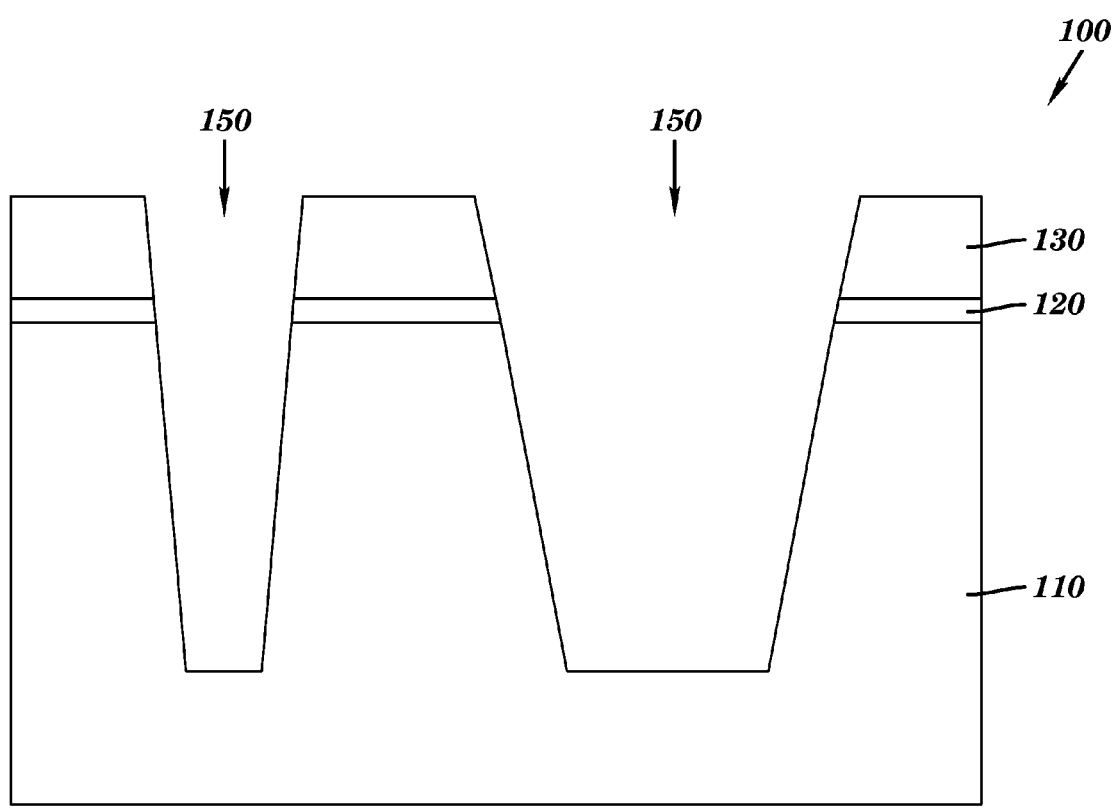
Figure 4:
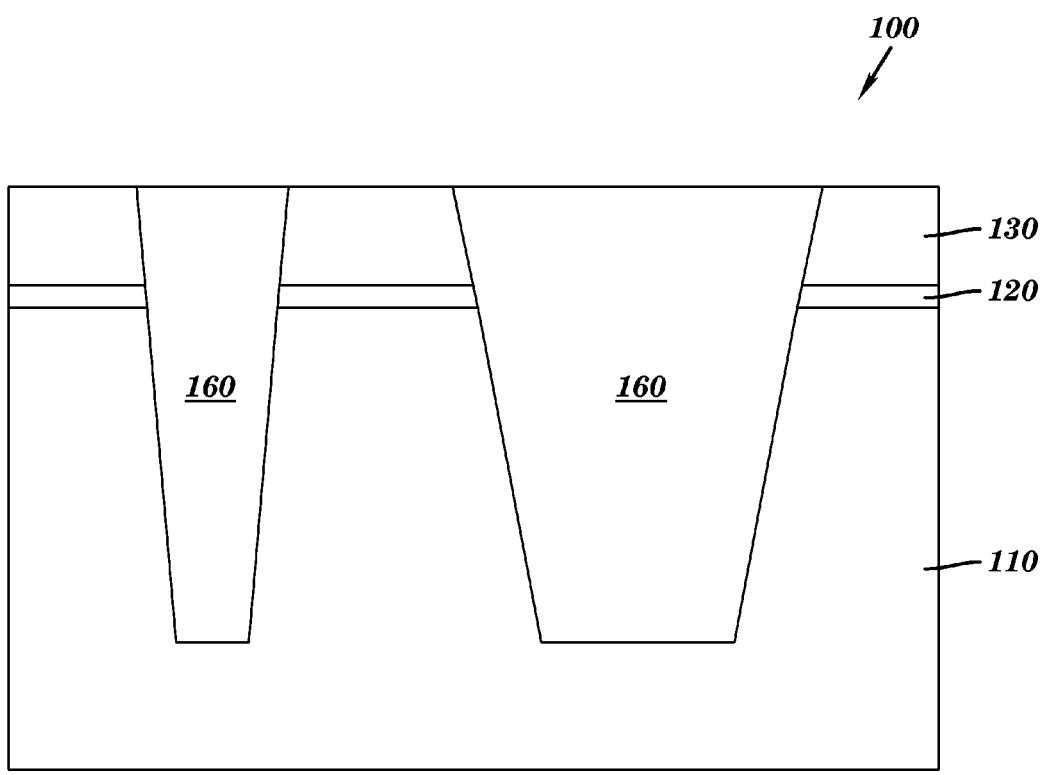
Figure 5:
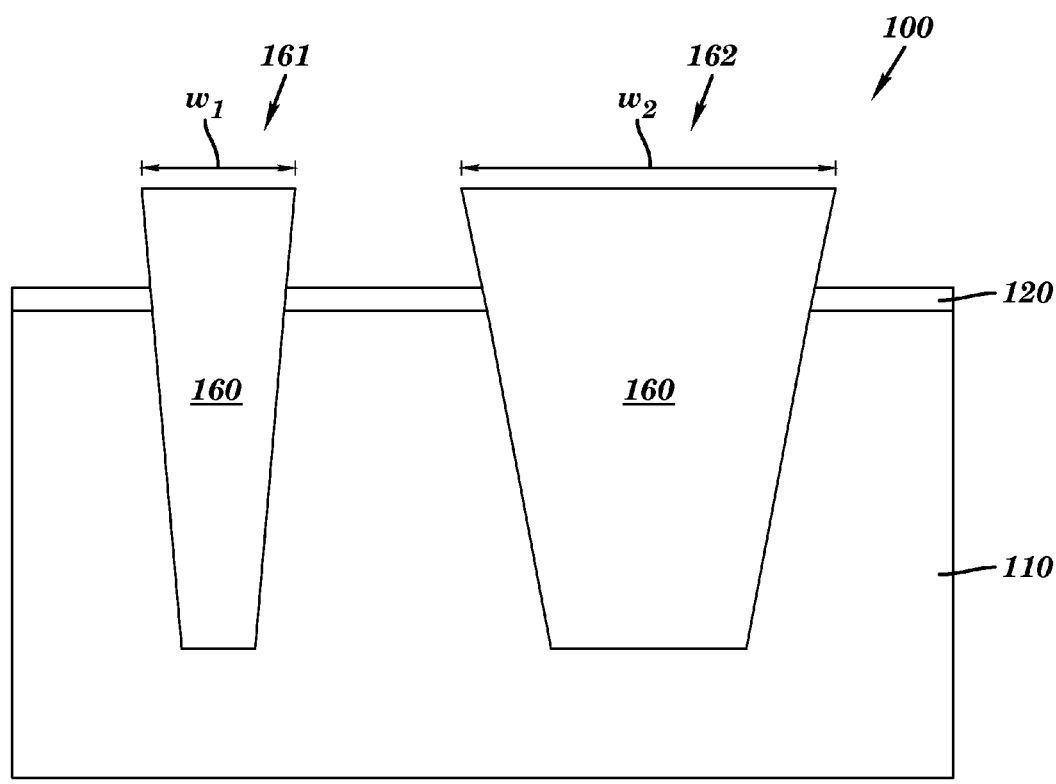
Figure 6:
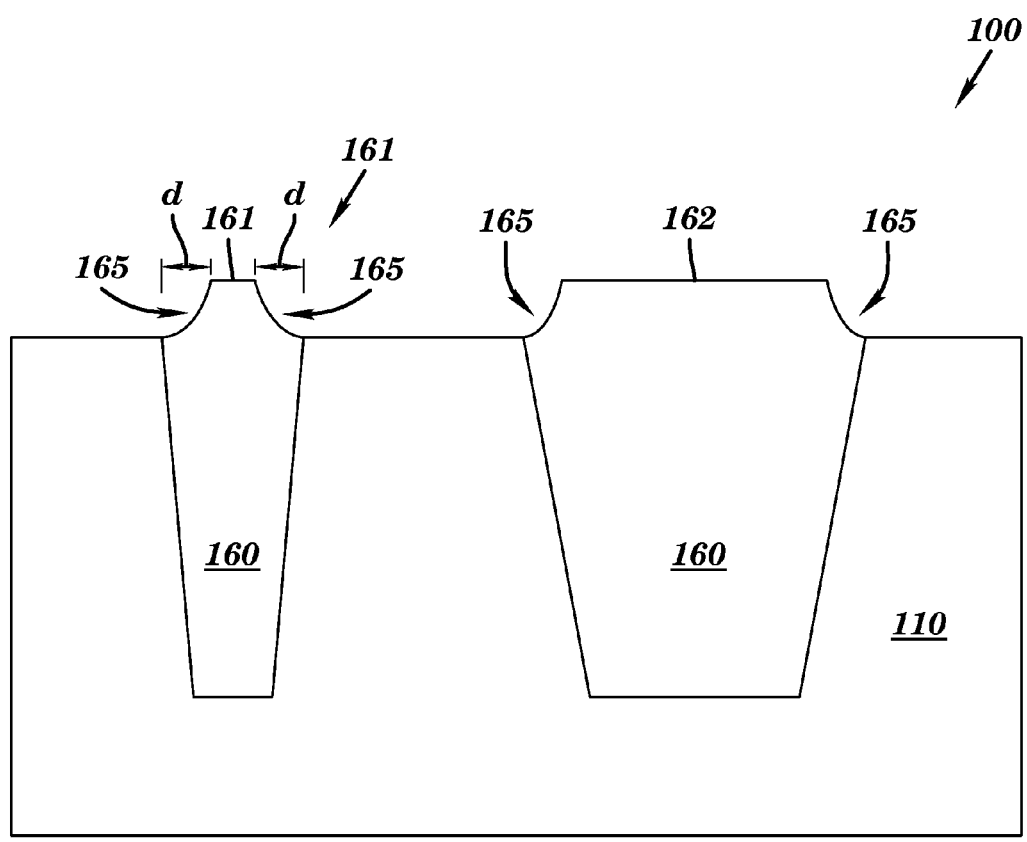
Figure 7:
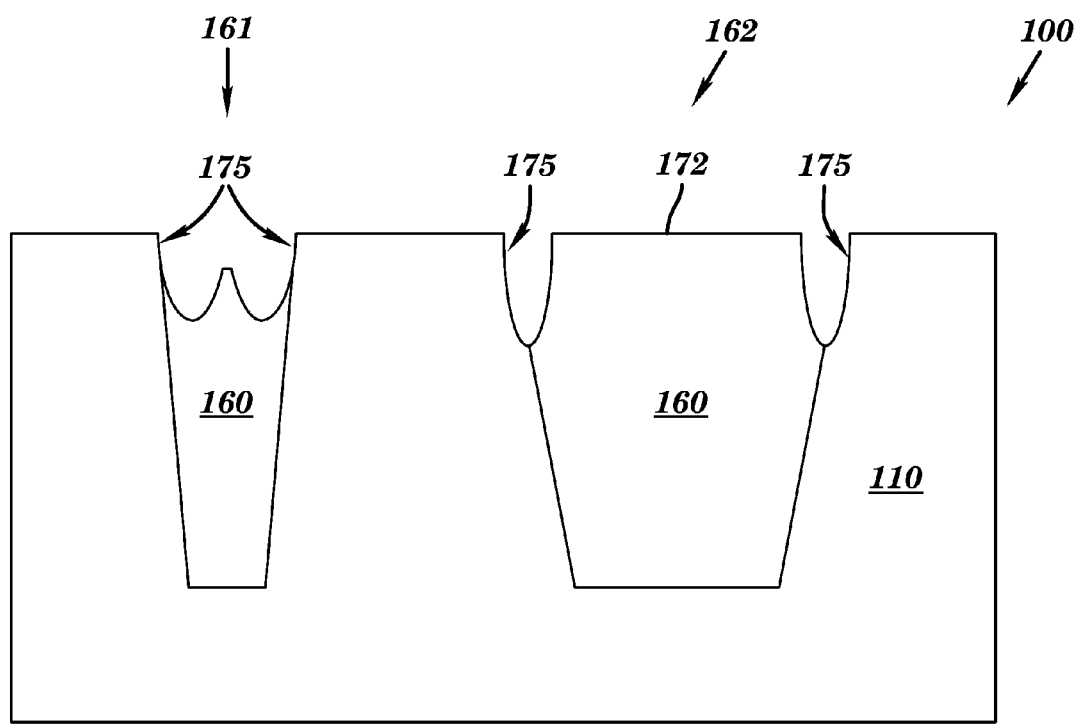
Figure 8:
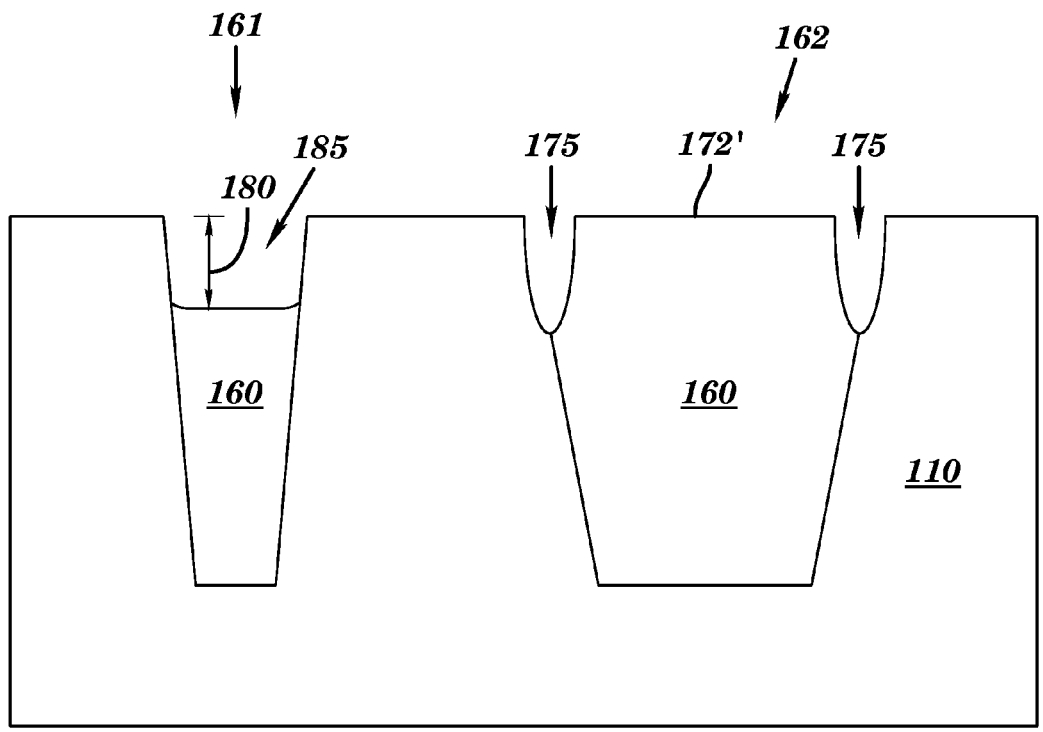
Figure 9:
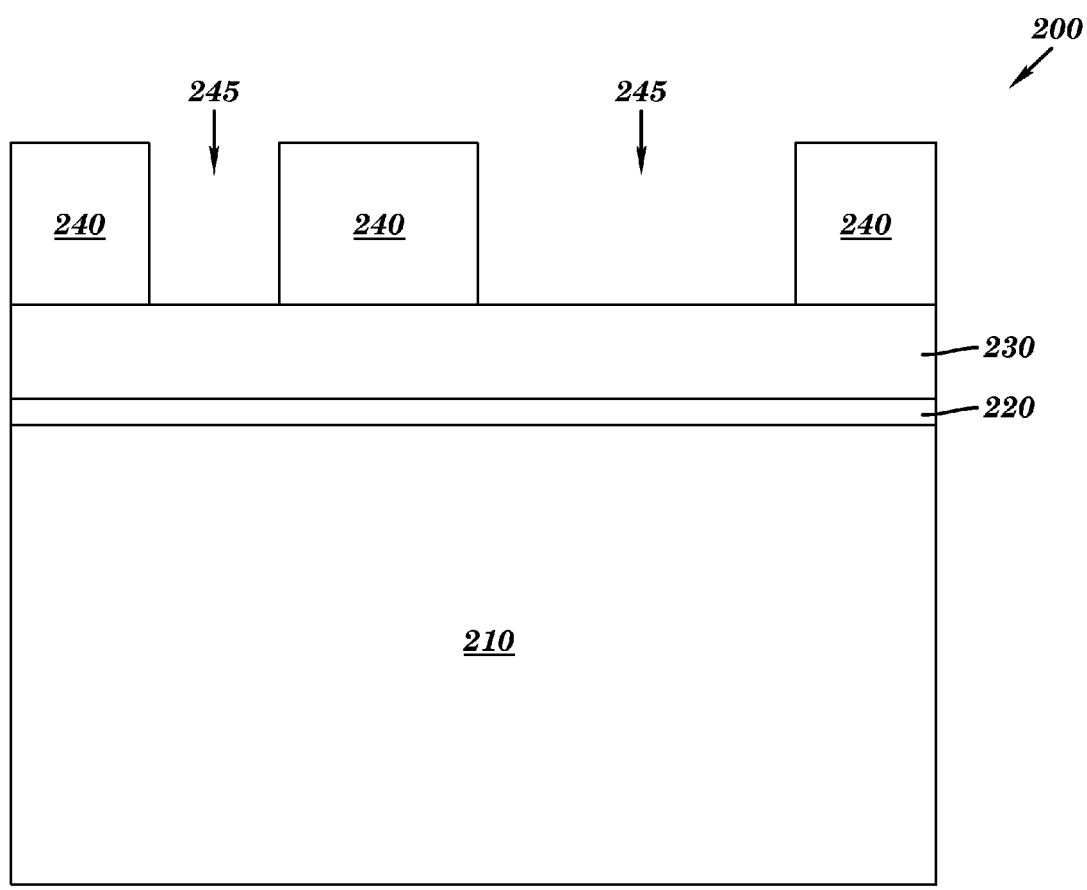
FIGS. 9-19 illustrate cross-sectional views of intermediate structures formed in an embodiment of a method in accordance with the invention.

FIG. 9 illustrates a wafer 200 including a semiconductor substrate 210, which may include any suitable semiconductor material, including, but not limited to bulk Si, Ge, SiGe, GaAs, SOI, SSOI (strained silicon on insulator), SSGOI (strained SiGe on insulator) and the like. A first dielectric layer 220 is formed atop the substrate 210, which may comprise, for example, an oxide, oxynitride, or any such dielectric material that provides etch resistance in the Hot Phosphoric Acid Chemistry. A second dielectric layer 230 is also provided atop the first dielectric layer 220. The second dielectric layer 230 may comprise a dielectric material such as nitride, which may be deposited by LPCVD (Low Pressure Chemical Vapor Deposition), RTCVD (Rapid Thermal Chemical Vapor Deposition) or PECVD (Plasma Enhanced Chemical Vapor Deposition) methods. The first dielectric layer 220 is preferably selected so as to be resistant to a wet etch of the second dielectric layer 230. For example, if the second dielectric layer 230 is a nitride, then the first dielectric layer 220 is preferably etch resistant in a hot phosphoric acid chemistry etch, which is a typical etch process for removing a pad nitride layer. A patterned photosensitive (resist) layer 240 is formed over the wafer 200, having openings 245 to expose the surface of the second dielectric layer 230.

Figure 10:
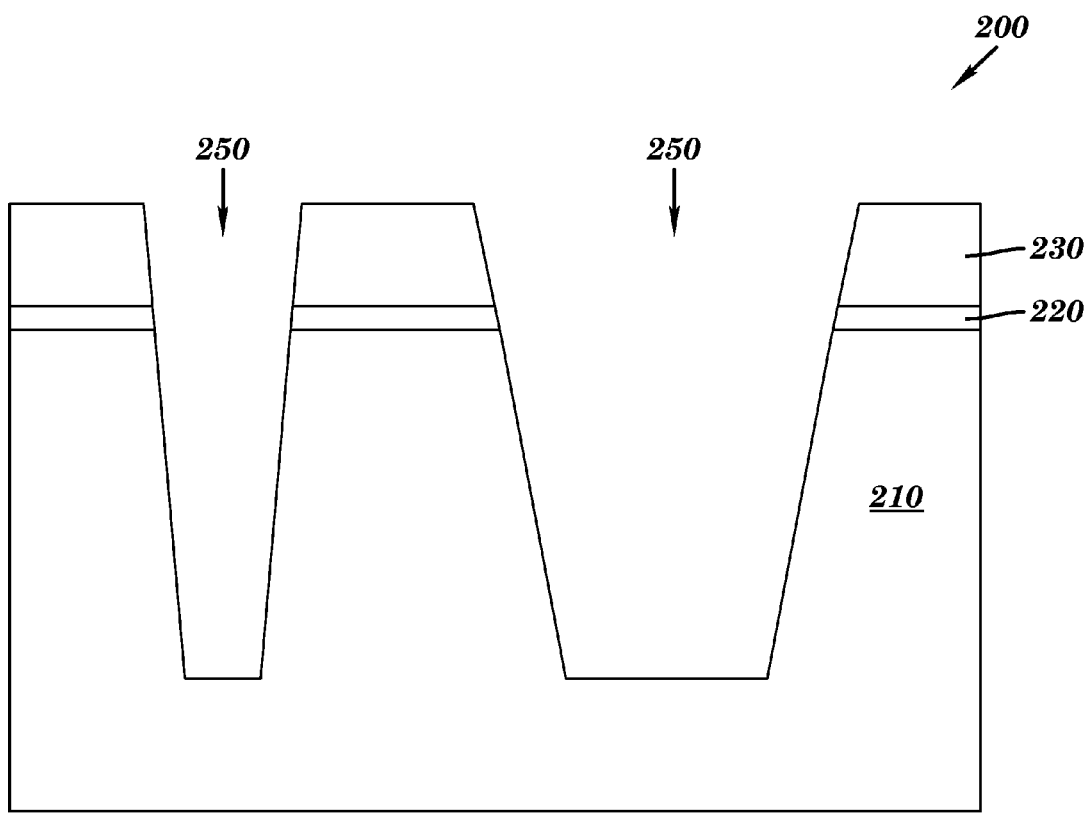
Figure 11:
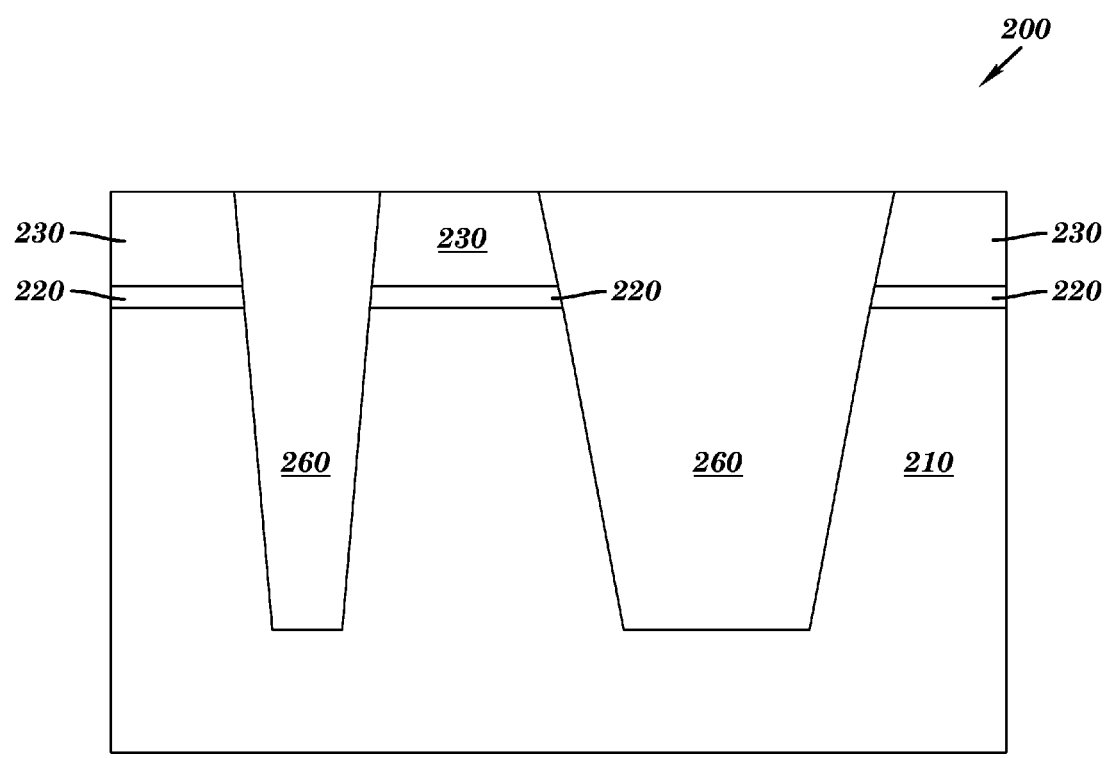

Next, referring to FIG. 10, trenches 250 are formed through the first and second dielectric layers 230, 220 and into the substrate 210, by performing an anisotropic etch, such as a reactive ion etch (RIE), through the openings 245 in the resist 240. The openings 245 will be used to form shallow trench isolation (STI) structures). The resist layer 240 may then be stripped, resulting in the structure illustrated in FIG. 10.

Next, the trenches 250 are filled with a third dielectric material 260, such but not limited to $SiO_2$. The third dielectric material 260 may be deposited over the wafer using a suitable method, such as a High Density Plasma (HDP) method, an SACVD (Sub-Atmospheric Chemical Vapor Deposition) process (which is a high aspect ratio process, also known as HARP), or the like. Alternatively, the third dielectric fill material 260 may comprise a polysiloxane or polysilazane-based material that may be deposited, for example, by spin coating. Prior to filling the trenches 250, the sidewalls may be optionally passivated (not shown). The third dielectric fill layer 260 may be annealed, as known in the art. The third dielectric material 260 is then planarized to be substantially co-planar with the second dielectric layer (e.g. the pad nitride) 230, for example, by chemical-mechanical polishing (CMP), stopping on the nitride. The trench fill dielectric 260 may be annealed either post-deposition, or post-polish. The resulting structure is illustrated in FIG. 12.

Figure 12:
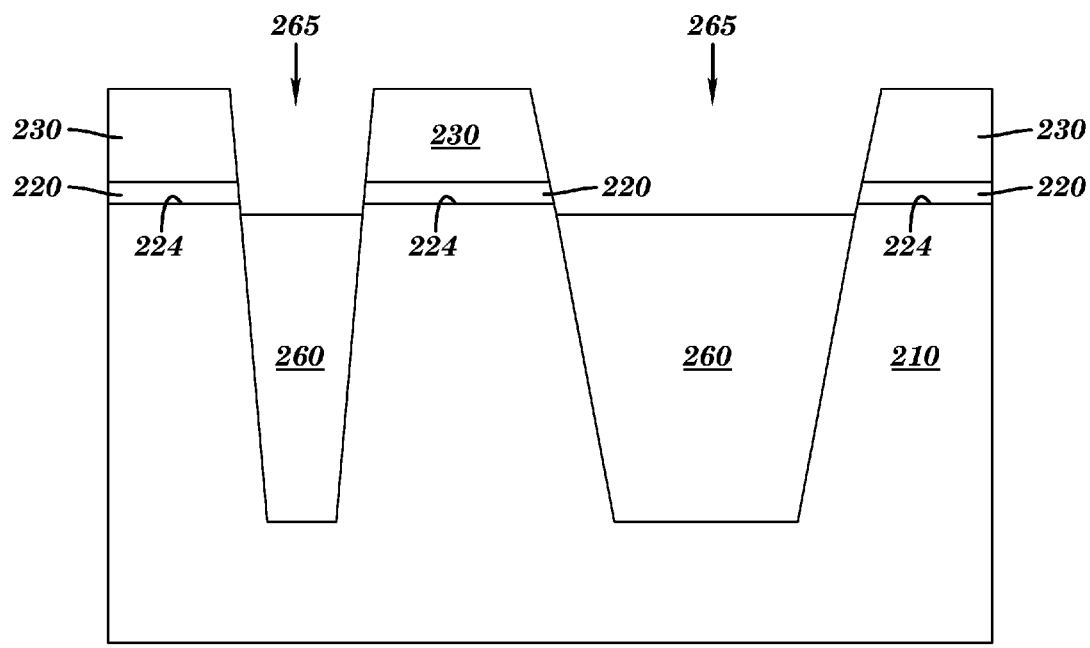

Referring to FIG. 12, in accordance with the invention, the third dielectric fill material 260 is etched selective to the nitride layer 230 to form recesses 265 so that the top surface 225 of the third dielectric fill 260 is recessed to a level that is essentially flush with or recessed about 10-100 Å below the top surface 224 of the substrate 210. The recess of the trench fill material 260 may be performed by a wet etch (such as a HF wet etch chemistry), RIE or a COR (Chemical Oxide Removal) process, for example.

Next, in accordance with the invention, a thin dielectric of a wet etch resistant layer 270' (see FIG. 16) is formed in contact with and at least completely covering the top surface 225 of the recessed third dielectric fill material 260. The wet etch resistant layer 270' may be comprised of a refractory dielectric material such as $Al_2O_3$, or may be comprised of an amorphous dielectric material that may be subsequently densified to become wet etch resistant, for example, $HfO_x$, $HfSiO_x$, $HfZrO_x$, and the like. The thin wet etch resistant layer 270' preferably has a thickness in the range from about 10 Å-100 Å, more preferably 10-50 Å, but must at least completely cover the top surface 225 of the recessed third dielectric fill material 260. The etch resistant layer 270' may comprise any dielelectric material that is more etch resistant than at least the first dielectric layer 220, and preferably also wet etch resistant as compared to the second and third dielectric layers.

Figure 13:
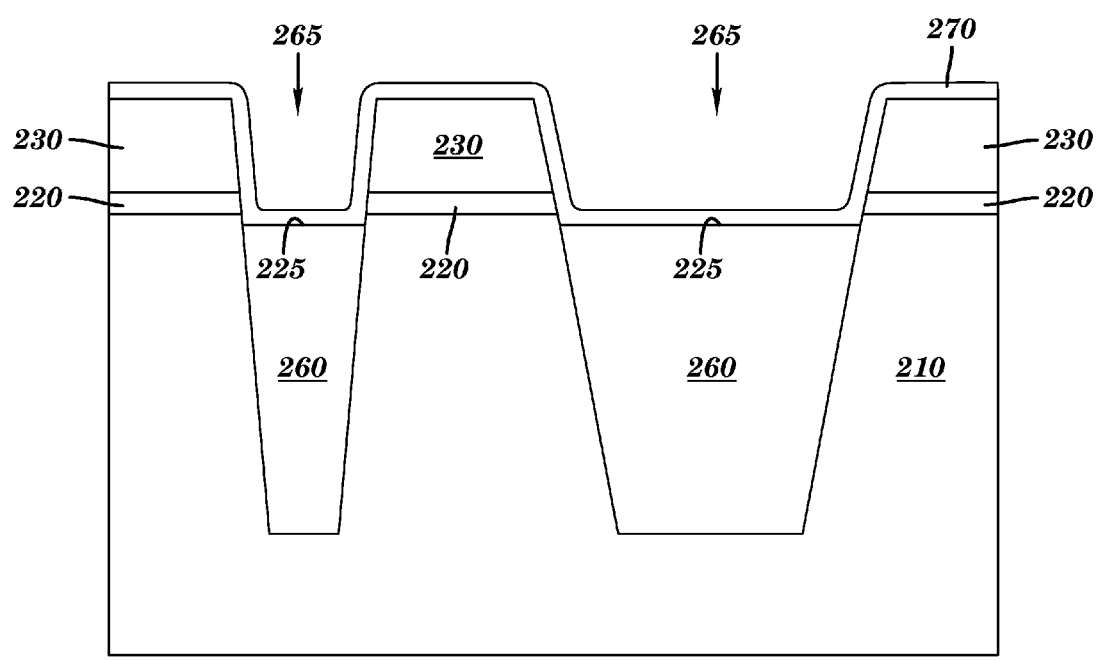

For the purposes of illustration, referring to FIG. 13, in an exemplary embodiment, the first dielectric layer 220 comprises $SiO_2$. A thin (i.e. having a thickness in the range from about 10 Å-100 Å) amorphous dielectric layer 270 comprising $HfO_x$ is blanket deposited over the surface of the wafer 200. Alternatively, the thin dielectric layer 270 may comprise $Al_yO_x$, $ZrO_x$, $HfZrO_x$, $HfSiO_x$, and the like. The thin dielectric layer 270 is preferably deposited conformally atop the surface of the wafer 200, for example, using thermal atomic layer deposition (ALD), or metal organic chemical-vapor deposition (MOCVD). Alternatively, the thin dielectric layer 270 may be deposited non-conformally using, for example, physical vapor deposition (PVD), as long as the uppermost top surface 225 of the recessed fill 260 is completely covered by the thin dielectric layer 270. The resulting structure is illustrated in FIG. 13.

Figure 14:
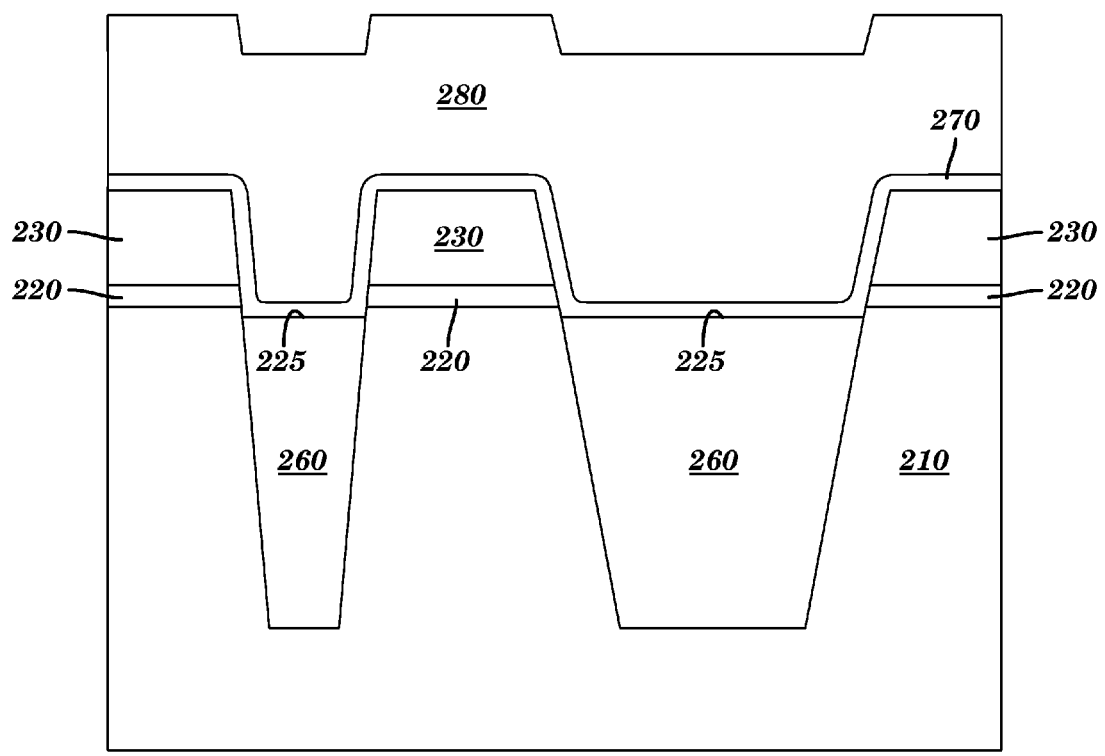
Figure 15:
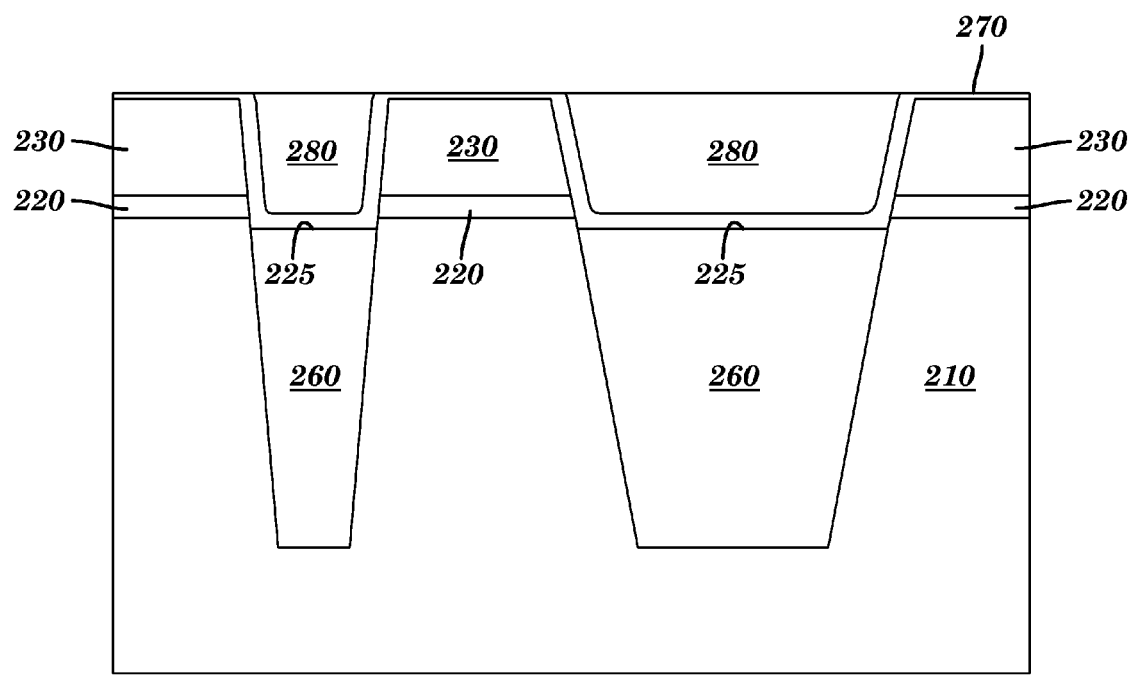

Next, in accordance with the invention, a fourth dielectric fill material 280 is deposited over the wafer 200. The fourth dielectric fill material 280 may be the same or different material than the third dielectric fill material 260. Preferably, the fourth dielectric fill material 280 is $SiO_2$, but could be any suitable dielectric such as polysiloxane, polysilazane, and the like. The fourth dielectric film 280 may be deposited by a variety of techniques including HDP (high density plasma), PECVD (Plasma Enhanced Chemical Vapor Deposition), RTCVD (Rapid Thermal Chemical Vapor Deposition), LPCVD (Low Pressure Chemical Vapor Deposition) or spin coating. The fourth dielectric film 280 will have topography on the top surface that corresponds to the underlying topography of the wafer, including the STI recesses 265. The resulting structure is illustrated in FIG. 14. The wafer 200 is then polished (e.g. using CMP), stopping on and partially removing the thin dielectric layer 270, resulting in the structure illustrated in FIG. 15. Next, the thin dielectric layer 270, e.g. $HfO_x$ in this example, is optionally, but preferably, removed from the horizontal top surface (field areas) of the nitride layer 230, by a method such as hot chuck RIE. For example, hot chuck RIE of $HfO_2$ may be carried out with wafer temperature in the range 250° C.-400° C. range using $BCl_3$ chemistry (boron trichloride). Hot chuck RIE using $BCl_3$ has good isotropic etch behavior and >200:1 selectivity to oxide, without causing an undercut in the $HfO_2$ cap. The removal of the thin dielectric layer 270 from atop the pad nitride layer 230 will ensure complete removal of the pad nitride layer 230 in a subsequent wet etch strip, such as a hot phosphoric acid strip.

Figure 16:
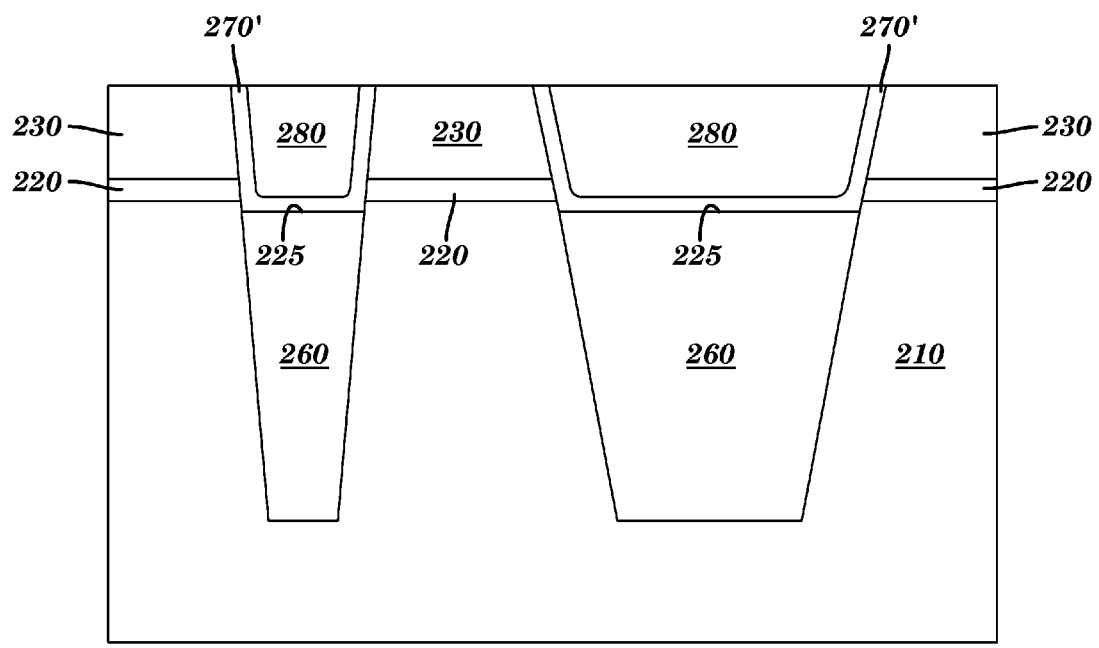

After planarization, as discussed above with reference to FIGS. 14-15, the fourth dielectric fill material 280 is substantially co-planar with the top surface of the second dielectric layer 230 (e.g. the pad nitride). If the remaining thin dielectric layer 270 is not sufficiently wet etch resistant, it may densified, for example, by a furnace annealing at temperatures in excess of 800° C. in $N_2$ or forming gas ambient, or using an RTA (rapid thermal anneal) at a temperature >800° C. This leads to hardening of the $HfO_2$ against HF chemistry, resulting in densified etch resistant layer 270'. This step typically also includes densification of the dielectric fill material (e.g. $SiO_2$) 280 as known in the art. The resulting structure is illustrated in FIG. 16.

Figure 17:
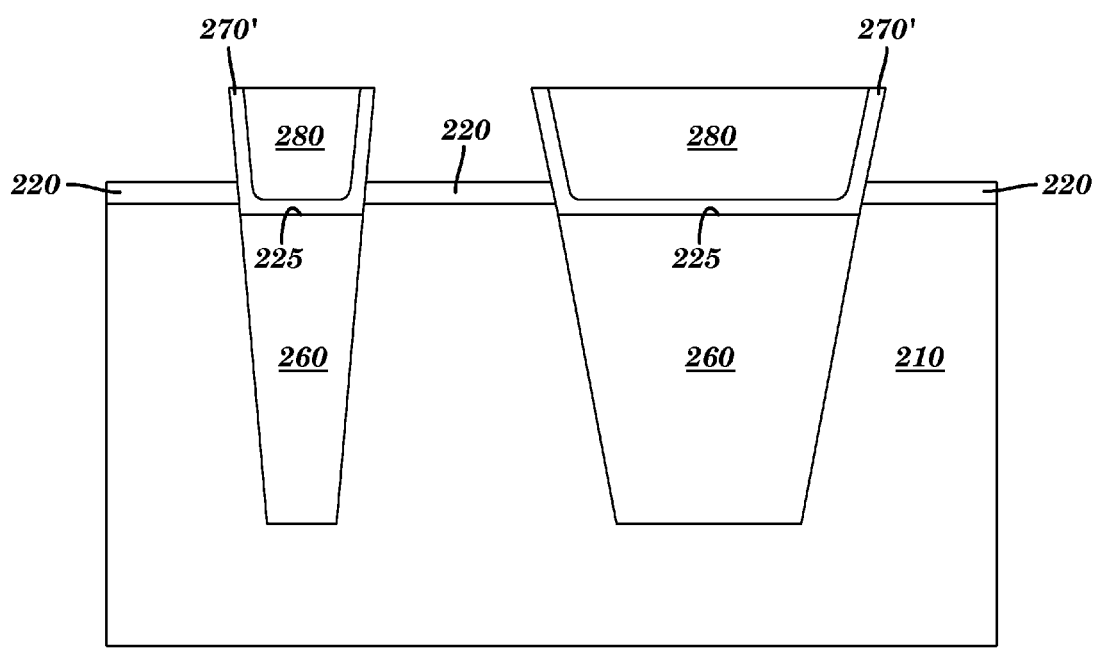

The second dielectric layer 230 (e.g. the pad nitride layer) is removed using a wet etch method, such as hot phosphoric acid, that is selective at least to the wet etch resistant (e.g. densified $HfO_2$) layer 270', and preferably also selective to the first dielectric material 220. Alternatively, HFEG (Hydrofluoric Acid+Ethylene Glycol) chemistry can also be used. Hot phosphoric acid is preferred since HFEG is not selective to the STI oxide. The presence of wet etch resistant cap 270' takes away the need for a thicker pad nitride. One benefit of the inventive wet etch resistant cap 270' is that a very thin pad nitride layer 230 can be used, having thickness in the range 10-200 Å, to serve as a CMP stop. The resulting structure is illustrated in FIG. 17. Note that the wet etch resistant layer 270' remains on the outer sidewalls of the islands of the fourth dielectric fill material 280.

Figure 18:
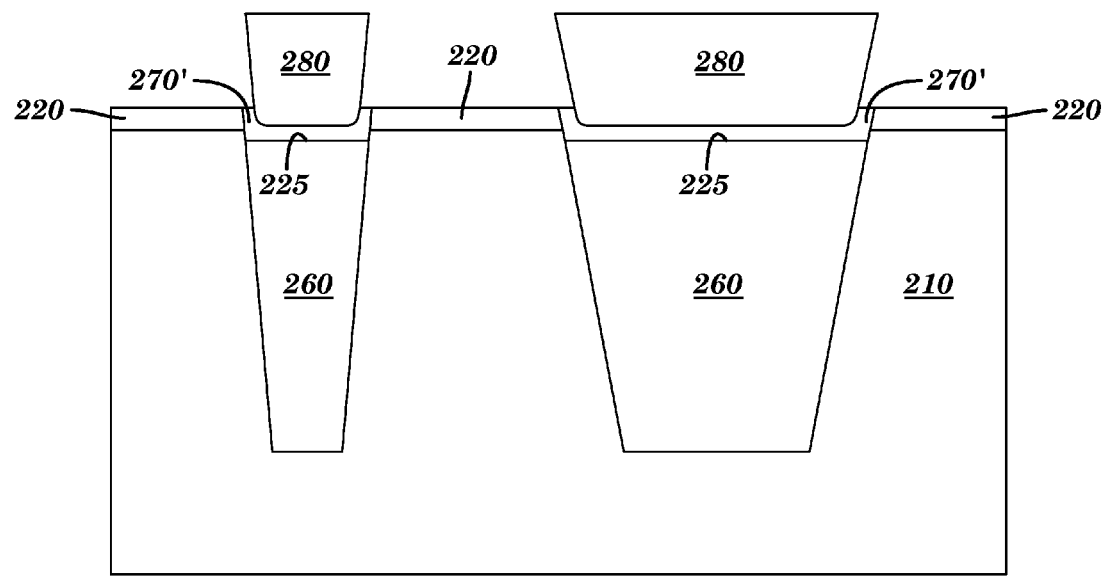

The wet etch resistant layer 270' is removed from the outer sidewalls of the fill material 280 above the surface of, and selective to, the first dielectric layer (e.g. the pad oxide) 220. This may be performed, for example, using a hot chuck RIE process, which has high selectivity to oxide, thus minimizing oxide loss in the fill material 280 and in the pad oxide 220. The resulting structure is illustrated in FIG. 18. Note that the remaining portion of the wet etch resistant layer 270' continues to cover the top surface 225 of the third dielectric fill 260.

Figure 19:
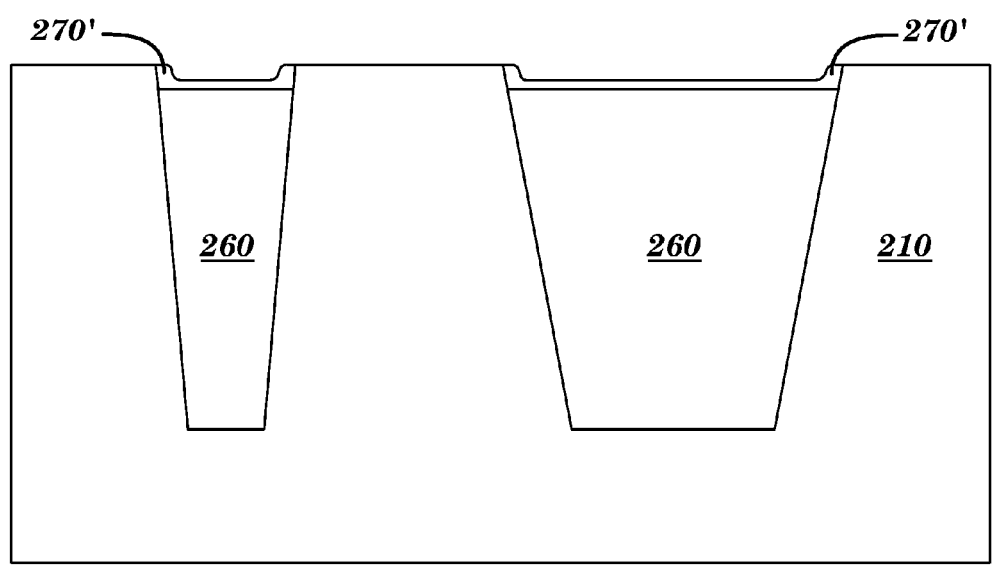

Next, additional wet etch processing may be performed, such as during the formation of multiple gate oxides, cSiGe (Channel SiGe), and the like, which leads to the removal of the fourth dielectric fill material 280 from the wet etch resistant layer 270' and also removal of the first dielectric material 220. The remaining wet etch resistant layer 270' continues to protect the surface of the third dielectric material 260 filling the trench and divots from wet etch processing in the STI fill 260 are avoided. The resulting structure is illustrated in FIG. 19.

The wafer 200 may then undergo further processing to complete the devices according to known processes.

Figure 20:
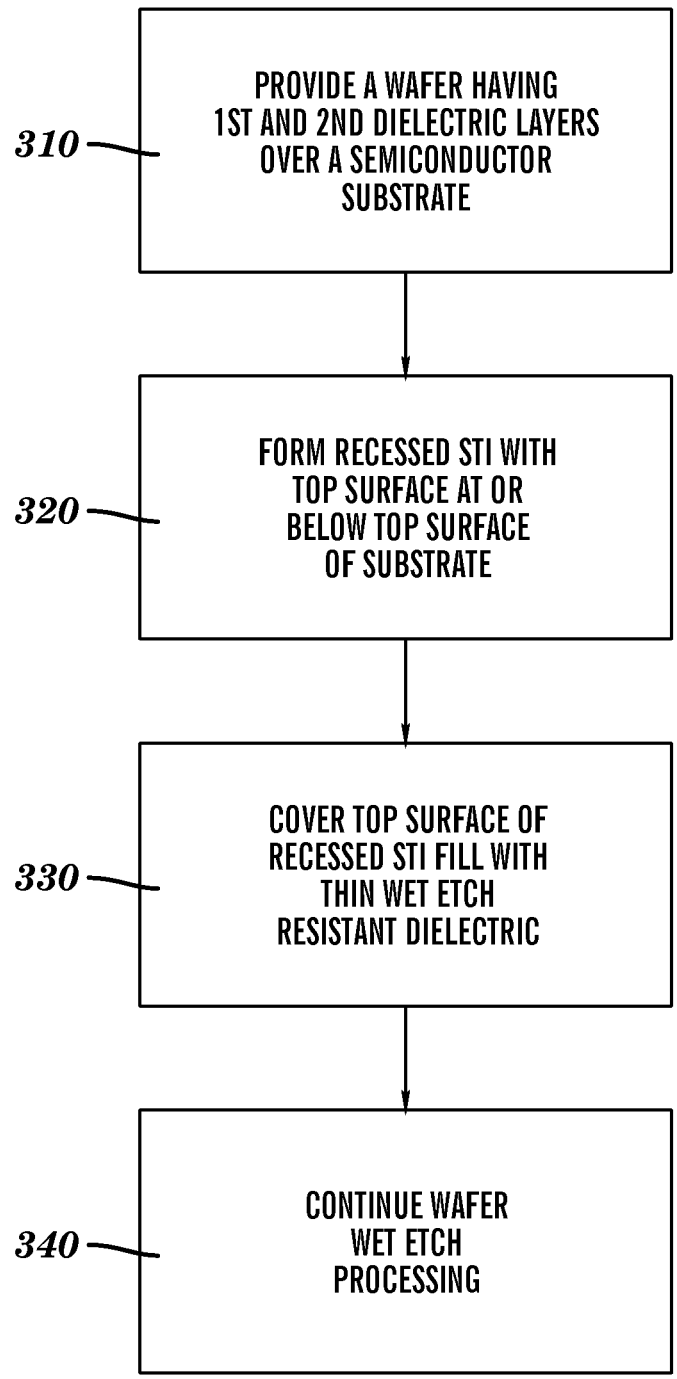
FIG. 20 illustrates an embodiment of process steps for forming a semiconductor structure in accordance with the invention.

An embodiment of a process in accordance with the invention is illustration in FIG. 20. A wafer is provided comprising a semiconductor substrate, having a top surface covered by a first dielectric (e.g. a pad oxide), and a second dielectric layer (e.g. a pad nitride) over the first dielectric layer (Block 310).

Recessed STI fill features are formed in the wafer so that the uppermost top surface of the recessed STI fill is essentially flush with or recessed about 10-100 Å below the uppermost top surface of the substrate (Block 320). Sidewalls of the first and second dielectric layers may be exposed in the recess over the recessed STI fill. The recessed STI features may be formed using any process currently known or developed in the future. For example, STI trenches may be formed by a patterned etch through the first and second dielectric layers and into the substrate using RIE. A dielectric fill material is blanket deposited over the wafer to fill the trenches, and the dielectric fill material is planarized, for example, using CMP stopping on the second dielectric. Next, the STI fill is recessed so that the top surface of the recessed STI fill is essentially flush with or recessed about 10-100 Å below the top surface of the substrate. The STI recess may be performed using a wet etch (such as a HF wet etch chemistry), RIE or a COR (Chemical Oxide Removal) process, for example.

Next, referring to Block 330, at least the top surface of the recessed STI fill is completely covered with a thin (i.e. having a thickness in the range from about 10 Å-100 Å, more preferably 10-50 Å) wet etch resistant dielectric layer. The wet etch resistant layer is wet etch resistant at least relative to the overlying dielectric layers, and in particular the first dielectric layer 220. The wet etch resistant layer may be comprised of a wet etch resistant dielectric material such as a refractory dielectric material such as $Al_yO_x$. Alternatively, the wet etch resistant layer may be formed by first depositing a thin amorphous dielectric layer comprising a material such as $HfO_x$, $ZrO_x$, $HfZrO_x$, $HfSiO_x$, and the like, followed by a densification step to convert the thin amorphous dielectric layer to a wet etch resistant layer. For example, the densification may be performed by furnace annealing at temperatures in excess of 800° C. in $N_2$ or forming gas ambient, or using an RTA (rapid thermal anneal) at a temperature >800° C.

Subsequently, the wafer may continue to be processed through multiple wet etch steps (Block 340). The inventive wet etch resistant layer has the advantage of increasing the wet etch budget by protecting the STI fill during subsequent wet etch processing.

While the present invention has been particularly described, in conjunction with a specific preferred embodiment, it is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed:

1. A method for manufacturing a semiconductor device, the method comprising the steps of:
    providing a wafer comprising a semiconductor substrate, a pad oxide layer atop the semiconductor substrate, and a pad nitride layer atop the pad oxide layer;
    forming at least one recessed shallow trench isolation (STI) feature in said wafer, said recessed STI feature comprising a trench filled with a third dielectric fill material, said third dielectric fill material having a top surface substantially coplanar with or recessed below the uppermost top surface of the semiconductor substrate, wherein said pad nitride layer and said pad oxide layer are exposed along sidewalls of said trench above the top surface of said third dielectric fill material;
    forming a thin wet etch resistant dielectric layer over the wafer, said thin wet etch resistant dielectric layer in contact with and completely covering at least the top surface of said third dielectric fill material, said thin wet etch resistant dielectric layer comprising a fourth dielectric material that is more resistant to a wet etch process than at least said pad oxide layer, said thin wet etch resistant dielectric layer having a thickness in the range from about 10 Å-100 Å;
    depositing a fourth dielectric fill material over said thin wet etch resistant dielectric layer;
    removing said fourth dielectric fill material and said thin wet etch resistant dielectric layer from the top surface of said pad nitride layer;
    removing said pad nitride layer using a wet etch method that is selective at least to said thin wet etch resistant dielectric layer; and
    removing portions of said thin wet etch resistant dielectric layer above said first dielectric pad oxide layer selectively to said pad oxide layer.

2. The method according to claim 1, wherein said thin wet etch resistant dielectric layer comprises a refractory dielectric material.

3. The method according to claim 1, wherein said thin wet etch resistant dielectric layer comprises a dielectric material selected from the group consisting of $HfO_x$, $Al_yO_x$, $ZrO_x$, $HfZrO_x$, and $HfSiO_x$.

4. The method according to claim 1, wherein said step of forming said thin wet etch resistant dielectric layer further comprises:
    depositing a thin amorphous dielectric layer that is in contact with and at least completely covers the top surface of said third dielectric fill; and
    densifying said thin amorphous dielectric layer to form said thin wet etch resistant dielectric layer.

5. The method according to claim 4, wherein:
    removing said fourth dielectric fill material and said thin amorphous dielectric layer from the top surface of said pad nitride layer occurs prior to said step of densifying said thin amorphous dielectric layer.

6. The method according to claim 1, wherein said step of removing portions of said thin wet etch resistant dielectric layer selectively to said pad oxide layer comprises a hot chuck RIE process.

7. The method according to claim 1, wherein said thin wet etch resistant dielectric layer is deposited conformally or non-conformally.

8. The method according to claim 7, wherein said thin wet etch resistant dielectric layer is deposited using a method selected from the group consisting of atomic layer deposition, metal organic chemical vapor deposition and physical vapor deposition.

9. The method according to claim 1, wherein said thin wet etch resistant layer comprises a densified $HfO_2$ material.

* * * * *